(12) United States Patent
Meng et al.

(10) Patent No.: US 8,363,757 B1
(45) Date of Patent: Jan. 29, 2013

(54) METHOD AND APPARATUS FOR ELIMINATING THE EFFECTS OF FREQUENCY OFFSETS IN A DIGITAL COMMUNICATION SYSTEM

(75) Inventors: Teresa H. Meng, Portola Valley, CA (US); David Su, Mountain View, CA (US); Masoud Zargari, Mountian View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 09/416,098

(22) Filed: Oct. 12, 1999

(51) Int. Cl.
*H04L 27/06* (2006.01)
(52) U.S. Cl. ........ 375/344; 375/260; 375/376; 375/371; 375/219; 375/355; 370/209; 370/208; 370/347
(58) Field of Classification Search .................. 375/344, 375/140, 147, 150, 219, 229, 232, 326, 355; 375/373, 316, 358, 371, 260, 343, 376, 364; 370/342, 335, 465, 206, 347, 509, 210, 310, 370/252; 455/69, 500; 708/490
See application file for complete search history.

(56) References Cited

U.S. PATENT DOCUMENTS

| | | | |
|---|---|---|---|
| 3,911,368 A | 10/1975 | Tarczy-Hornoch | 328/155 |
| 5,261,118 A | 11/1993 | Vanderspool, II et al. | |
| 5,313,169 A * | 5/1994 | Fouche et al. | 329/302 |
| 5,400,322 A | 3/1995 | Hunt et al. | |
| 5,499,236 A | 3/1996 | Giallorenzi et al. | |
| 5,506,867 A | 4/1996 | Kotzin et al. | |
| 5,543,697 A * | 8/1996 | Carobolante et al. | 318/594 |
| 5,561,701 A | 10/1996 | Ichikawa | |
| 5,579,321 A | 11/1996 | Van Grinsven et al. | 370/95.3 |
| 5,602,835 A * | 2/1997 | Seki et al. | 370/206 |
| 5,691,389 A | 11/1997 | Parrinello et al. | |
| 5,694,389 A | 12/1997 | Seki et al. | 370/208 |
| 5,726,978 A * | 3/1998 | Frodigh et al. | 370/252 |
| 5,727,037 A * | 3/1998 | Maneatis | 375/376 |
| 5,732,113 A * | 3/1998 | Schmidl et al. | 375/355 |
| 5,742,527 A | 4/1998 | Rybicki et al. | |

(Continued)

FOREIGN PATENT DOCUMENTS

EP 0 833 482 A2 4/1988
EP 0874494 10/1998

(Continued)

OTHER PUBLICATIONS

Alvin M. Despain, "Very Fast Fourier Transform Algorithms Hardware for Implementation", IEEE Transactions on COmputers, vol. C-28, No. 5, May 1979, p. 333-341.

(Continued)

*Primary Examiner* — Eva Puente
(74) *Attorney, Agent, or Firm* — Bever, Hoffman & Harms, LLP (57) ABSTRACT

The present invention aims at eliminating the effects of frequency offsets between two transceivers by adjusting frequencies used during transmission. In this invention, methods for correcting the carrier frequency and the sampling frequency during transmission are provided, including both digital and analog implementations of such methods. The receiver determines the relative frequency offset between the transmitter and the receiver, and uses this information to correct this offset when the receiver transmits its data to the original transmitter in the return path, so that the signal received by the original transmitter is in sampling and carrier frequency lock with the original transmitter's local frequency reference.

14 Claims, 5 Drawing Sheets

U.S. PATENT DOCUMENTS

| | | | | |
|---|---|---|---|---|
| 5,742,908 | A * | 4/1998 | Dent | 455/517 |
| 5,751,776 | A * | 5/1998 | Shiino et al. | 375/371 |
| 5,781,847 | A * | 7/1998 | Clarke et al. | 455/69 |
| 5,794,119 | A | 8/1998 | Evans et al. | |
| 5,802,044 | A | 9/1998 | Baum et al. | |
| 5,805,029 | A * | 9/1998 | Theus et al. | 331/116 FE |
| 5,818,889 | A * | 10/1998 | Cook | 375/364 |
| 5,828,660 | A | 10/1998 | Baum et al. | |
| 5,828,705 | A * | 10/1998 | Kroeger et al. | 375/326 |
| 5,870,427 | A | 2/1999 | Tiedemann, Jr. et al. | |
| 5,878,101 | A * | 3/1999 | Aisaka | 377/47 |
| 5,914,932 | A | 6/1999 | Suzuki et al. | |
| 5,920,557 | A | 7/1999 | Hirata | |
| 5,930,268 | A | 7/1999 | Kurby et al. | 370/509 |
| 5,966,644 | A | 10/1999 | Suzuki | |
| 5,970,093 | A * | 10/1999 | de Lantremange | 375/234 |
| 5,982,809 | A * | 11/1999 | Liu et al. | 375/147 |
| 6,005,893 | A | 12/1999 | Hyll | |
| 6,034,990 | A * | 3/2000 | Kang | 375/219 |
| 6,044,067 | A | 3/2000 | Suzuki | |
| 6,125,103 | A | 9/2000 | Bauml et al. | |
| 6,160,820 | A | 12/2000 | Isaksson et al. | |
| 6,169,733 | B1 * | 1/2001 | Lee | 370/342 |
| 6,212,397 | B1 * | 4/2001 | Langston et al. | 455/500 |
| 6,215,778 | B1 | 4/2001 | Lomp et al. | |
| 6,275,518 | B1 | 8/2001 | Takahashi et al. | |
| 6,470,005 | B1 * | 10/2002 | Knutson et al. | 370/347 |
| 6,628,673 | B1 | 9/2003 | McFarland et al. | |
| 6,807,146 | B1 | 10/2004 | McFarland | |
| 6,876,675 | B1 * | 4/2005 | Jones et al. | 370/509 |
| 2007/0053462 | A1 * | 3/2007 | Pirooz et al. | 375/285 |
| 2007/0140212 | A1 * | 6/2007 | Gaikwad et al. | 370/350 |

FOREIGN PATENT DOCUMENTS

| | | |
|---|---|---|
| GB | 2277232 A | 10/1994 |
| WO | WO97/19557 | 5/1997 |
| WO | WO99/34529 | 7/1999 |
| WO | WO9949587 A1 | 9/1999 |
| WO | WO9950985 A1 | 10/1999 |
| WO | WO9965155 A1 | 12/1999 |

OTHER PUBLICATIONS

Bingham, John A.C.: "Multicarrier Modulation for Data Transmission: An Idea Whose Time Has Come," IEEE Communications Magazine, p. 5-14 (May 1990).

Chen Q. et al: Multicarrier CDMA with Adaptive Frequency Hopping for Mobile Radio Systems IEEE Journal on Selected Areas in Communications, US, IEEE Inc. New York, vol. 14 No. 9, Dec. 1, 1996, pp. 1852-1858.

Chuang, "An OFDM-based system with dynamic packet assignment and interference suppression for advanced cellular internet service" (IEEE Globecom 1998 pp. 974-979).

Clark D. Thompson "Fourier Transforms in VLSI", IEEE Transactions on Computers, vol. C-32, No. 11, Nov. 1993, pp. 1047-1057.

Gregory Pottie et al., "Channel Coding Strategies for Celluar Radio", IEEE International Symposium on Information Theory, Jan. 17, 1993, San Antonio Texas.

Hakan Olofsson et al., "Interference Diversity Gain in Frequency Hopping GSM", IEEE 45th Vehicular Technology Conference, Jul. 25, 1995, Chicago, Illinois.

Hamid Alikhani et al., "BDMA Band Division Multiple Access, A New Air-Interface for 3rd Generation Mobile System, UMTS, in Europe"p. 482-488.

Hermann Rohling et al., : "Performance Comparison of Different Multiple Access Schemes for the Downlink of an OFDM Communication System", Vehicular Technology Conference, 1997, 47th IEEE, vol. 3, May 3-7, 1997, pp. 1365-1369.

Hermann Rohling et al., "Comparison of Multiple Access Schemes for an OFDM Downlink System", Multi-Carrier Spread-Spectrum, 1997, p. 23-30, Kluwer Academic Publishers, Netherlands.

International Preliminary Examination Report—PCT/US2000/041164, IPEA/US, Jul. 25, 2002.

International Search Report—PCT/US2000/041164, International Searching Authority—European Patent Office, May 9, 2001.

Okhawa M. Et Al: Orthogonal MultiCarrier Frequency Hopping-Code Division Multiple Access Scheme for Frequency-Selective Fading Electronics and Communications in Japan, Part 1—Communications Scripta Technica. New York, US, vol. 78, No. 8. Aug. 1 1995, pp. 86-98.

Shinsuke Hara et al., "Transmission Performance Analysis of Multi-Carrier Modulation in Frequency Selective Fast Rayleigh Fading Channel", Wirless Personal Communications 2, 1996, p. 335-356, Kluwer Academic Publishers, Netherlands.

Van De Beek et al., 'A Time and Frequency Synchronization Scheme for Multiuser OFFDM', Nov. 1999, IEEE Journal on Selected Areas in Communication, vol. 17, No. 11, p. 1900-1914.

Viterbi, "The orthogonal-random waveform dichotomy for digital mobile personal communication" (Proc. 1993 IEEE Int'l Symposium on Information Theory, Jan. 17-22, 1993, pp. 18-23).

Wolfgang Eberle et al., "Design Aspects of an OFDM Based Wireless LAN With Regard to ASIC Integration", Published at 2. OFDM-Fachgersprach, Braunschweig, Germany, Sep.16-17, 1997. 4 pp.

Honig et al., "Blind Adaptive Multiuser Detection" (IEEE Trans. on Information Theory, pp. 944-960, vol. 41, No. 4, Jul 1995).

Le Floch et al., "Coded Orthogonal Frequency Division Multiplex" (IEEE Proceedings, pp. 982-996, vol. 83, No. 6, Jun. 1995).

Meyr et al., Digital Communication Receivers, Chapter 10: "DSP System Implementation" (John Wiley and Sons, 1998, New York).

Meyr et al., Digital Communication Receivers, Chapter 5: "Synthesis of Synchronization Algorithms" (John Wiley and Sons, 1998, New York).

Mueller et al., "Timing recove in digital synchronous data receivers" (IEEE Trans. Communications, vol. COM-24, pp. 516-531, May 1976).

Sklar, Digital Communications: Fundamentals and Applications, Chapter 8: "Synchronization in the Context of Digital Communications" (Prentice Hall, 1988, New Jersey).

Verdu, Multiuser Detection, Chapter 6: "Nondecorrelating Linear Multiuser Detection" (Cambridge University Press, 1998).

Verdu, Multiuser Detection, Chapter 7: "Decision-Driven Multiuser Detectors" (Cambridge University Press, 1998).

* cited by examiner

METHOD AND APPARATUS FOR ELIMINATING THE EFFECTS OF FREQUENCY OFFSETS IN A DIGITAL COMMUNICATION SYSTEM

BACKGROUND OF THE INVENTION

1. Field of the Invention

The present invention relates to digital communications, and more particularly, to methods for correcting carrier frequency and sampling frequency at the transmitter to eliminate the effects of offsets in such frequencies.

2. Description of the Related Art

In a digital communication system composed of at least two transceivers, one serving as a transmitter and the other as a receiver, problems occur if the reference frequencies of the two transceivers are not exactly the same.

There are in general two sources of frequency offsets: carrier frequency offsets and sampling frequency offsets. Carrier frequency offsets result in the received signal being demodulated by a wrong carrier frequency, while sampling frequency offsets result in the data being sampled at the wrong time instants. Typically, the percentages of the carrier frequency offset and the sampling frequency offset would be the same if a single oscillator reference is used to generate the two frequencies at both the transmitter and the receiver. The percentages of the two frequency offsets will be different if different oscillator references are used.

Conventionally, such frequency offsets are only detected and corrected during processing at the receiver end. For example, the receiver can employ a carrier frequency lock loop to determine the carrier frequency offset and a delay lock loop to determine the sampling frequency offset. Such mechanisms are only used to detect the frequency offset between the transmitter and the receiver, and to compensate for offset effects at the receiver end. See, for example: H. Meyr, M. Moeneclaey, and S. Fechtel, *Digital Communication Receivers*, Wiley-Interscience Publication, 1998; S. Kay, "A fast and accurate single frequency estimator," *IEEE Trans. on Acoustics, Speech, and Signal Processing*, December 1989; Viterbi and A. Viterbi, "Nonlinear estimation of PSK-modulated carrier phase with application to burst digital transmission," *IEEE Trans. on Information Theory*, July 1983; M. Fitz, "Further results in the fast estimation of a single frequency," *IEEE Trans. on Communications*, February 1994; and D. Messerschmitt, "Frequency detectors for PLL acquisition in timing and carrier recovery," *IEEE Trans. on Information Theory*, September 1979.

Conventional techniques for reducing the effects of frequency offsets at the receiving end have many shortcomings. For example, if narrow-band frequency division multiple access (FDMA) is used to provide multiple access from different users, the carrier frequency offsets in the reverse link (from end-users to the base-station) might cause data to overlap in frequency at the base-station receiver. On the other hand, if time division multiple access (TDMA) is used to provide multiple access from different users in the reverse link, sampling frequency offsets might cause data to overlap in time at the base-station receiver.

In more advanced communication systems that employ either multi-user detection in a code division multiple access (CDMA) system, or multi-carrier modulation in an orthogonal frequency division multiplexing (OFDM) system, frequency offsets are particularly damaging in signal detection in the reverse link. For example, in CDMA systems where multiple user access is provided via multiple remote units, multi-user detection can be employed at the base station for interference rejection. See, for example, S. Verdu, *Multiuser Detection*, Cambridge University Press, 1998. However, the carrier frequency offsets introduced in the reverse link by the various remote units, if not corrected during transmission by the remote units, will destroy the stationary properties of the combined signal as received by the base station, thus greatly degrading the multi-user detection performance. Similarly, in an OFDM system, multiple frequency carriers are used to transmit data to and from multiple users. See, for example, B. Le Floch, M. Alard, and C. Berrow, "Coded Orthogonal Frequency Division Multiplex," *Proceedings of IEEE*, pp. 982-996, Vol. 83, No. 6, June 1995. If multiple remote users use different carrier frequencies to transmit data at the same time in an OFDM system, as in the reverse link of a CDMA system, the frequency offsets in both carrier frequency and sampling frequency will cause the data from different users to overlap in both frequency and time, again greatly degrading the multi-carrier detection performance.

Accordingly, there remains a need in the art for techniques for reducing frequency offsets that improve the signal detection capability of the combined signals received from multiple remote units in a base station, and in general between any two transceivers. The present invention fulfills this need, among others.

SUMMARY OF THE INVENTION

Accordingly, an object of the present invention is to overcome the problems of the prior art, including the problems identified above.

Another object of the present invention is to improve signal detection capability of combined signals received from multiple remote units in a base station, and in general between any two transceivers.

Another object of the invention is to correct frequency offsets between transceivers, and particularly between a base station and a remote unit.

Another object of the invention is to correct carrier frequency offsets between transceivers, and particularly between a base station and a remote unit.

Another object of the invention is to correct sampling frequency offsets between transceivers, and particularly a base station and a remote unit.

Another object of the invention is to correct for frequency offsets between transceivers, and particularly a base station and a remote unit, by adjusting a carrier frequency before transmission.

Another object of the invention is to correct for frequency offsets between transceivers, and particularly a base station and a remote unit, by adjusting a sampling frequency before transmission.

To achieve these objects and others, the invention aims at eliminating the effects of frequency offsets between transceivers by adjusting frequencies used during transmission. In this invention, methods for correcting the carrier frequency and the sampling frequency during transmission are provided, including both digital and analog, and closed and open loop implementations of such methods. The receiver determines the relative frequency offset between the transmitter and the receiver, and uses this information to correct this offset when the receiver transmits its data to the original transmitter in the return path, so that the signal received by the original transmitter is in frequency lock with the original transmitter's local frequency reference.

BRIEF DESCRIPTION OF THE DRAWINGS

These and other objects and advantages of the present invention, along with the best mode for practicing it, will become apparent to those skilled in the art after considering the following detailed specification, together with the accompanying drawings wherein.

DETAILED DESCRIPTION OF THE INVENTION

Figure 1:
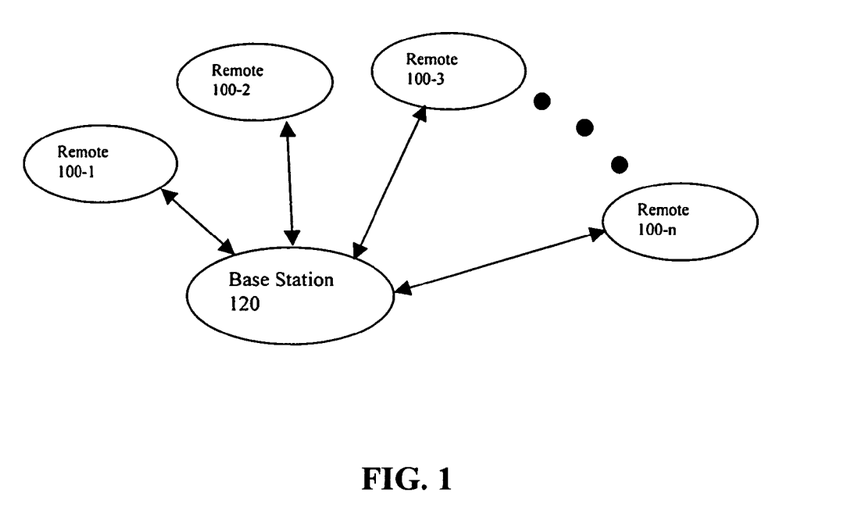
FIG. 1 illustrates a communication system in accordance with the invention.

FIG. 1 illustrates a preferred embodiment in which a base station (transceiver 120) communicates with multiple remote (e.g. hand-held and/or mobile) units (transceiver 100-1, transceiver 100-2, etc.).

In the discussion below, CDMA is preferred as the carrier modulation technique to provide multiple user access and multi-user detection is preferably employed at the base station for interference rejection. The carrier and sampling frequency offsets introduced by various remote units, if not appropriately corrected during transmission, will destroy the stationary properties of the combined signal as received by the base station. According to an aspect of the invention, therefore, each remote unit 100 corrects the frequency offsets during transmission as will be described in more detail below, thus creating a low IF modulation and interpolation effect, before sending the signal to the analog front-end circuitry. Although the invention is particularly useful for CDMA modulation techniques, the invention is not limited to this example, but should be particularly useful for many other modulation techniques where frequency offsets can introduce difficulties such as multi-user detection systems employing antenna diversity or smart antennas. In fact, any modulation or diversity schemes that rely on accurate frequency and/or time resolution can benefit from this invention, which include, but not limited to, previously mentioned OFDM systems, discrete multiple tone (DMT) systems, multiple antenna systems, narrow-band FDMA systems, or TDMA systems. Moreover, although the invention is particularly useful and generally described herein with reference to multi-user systems with a base station and multiple remote units, it should be apparent that the principles of the invention can be extended to two or any number of transceivers in mutual communication.

Figure 2:
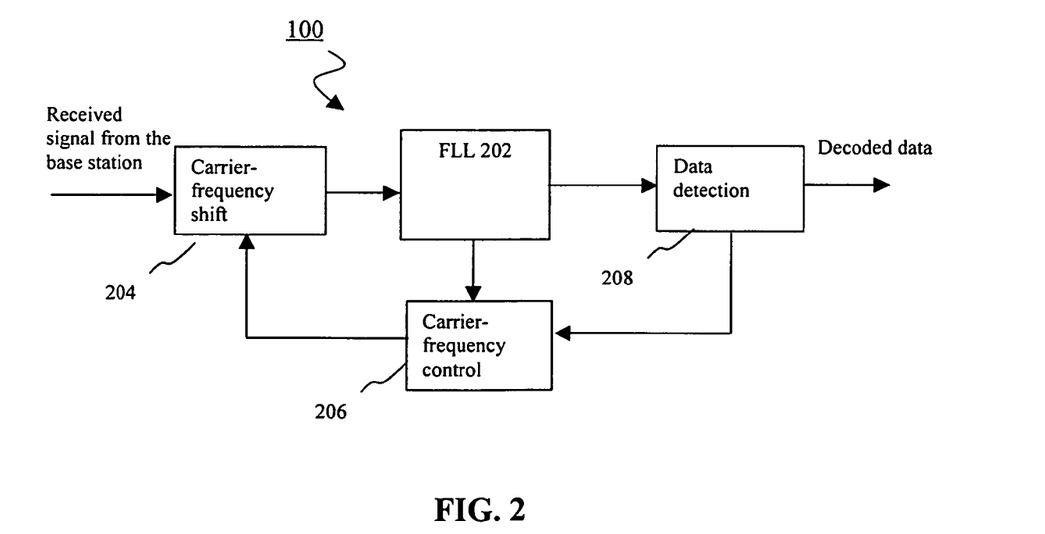
FIG. 2 illustrates a receiver in a remote unit that detects carrier frequency offsets in accordance with a first embodiment of the invention.

A first preferred embodiment of the invention provides for digital correction of carrier frequency offsets. In this embodiment, a receiver in a remote unit 100 employs a frequency-lock loop 202, as illustrated in FIG. 2, to detect the carrier frequency offset between the base station and the remote unit. More particularly, the received signal from the base station, after down-conversion mixing to the baseband and A/D conversion, is digitally shifted in frequency to DC by multiplying the received signal with a complex sinusoidal (or a simple sinusoidal if the data is real only) using frequency shift block 204. The frequency of the complex sinusoidal is the carrier frequency offset between the base-station and the remote unit. The actual frequency used in the multiplication is determined by carrier frequency control block 206. This is done by either feed-forward or feed-back frequency lock loop (FLL 202) using the correlation between the received and the detected data.

FLL 202 can be implemented by any one of many conventional frequency lock loop methods including the publications referred to above, and a detailed description thereof is not considered necessary for an understanding of the present invention. Frequency shift block 204 can be implemented by, for example, a dedicated-hardware complex or simple multiplier or software executing on a digital signal processor. Frequency control block 206 can be implemented by, for example, dedicated-hardware control circuits or software executing on a digital signal processor. The designs of both blocks are commonly known by those skilled in the art.

When there is a difference between the carrier frequency used by remote unit 100 in performing the down-conversion mixing and the carrier frequency used by the base station, the baseband signal will have an offset. This offset is block 204 effectively cancelled by 202. The resulting baseband signal is then usable for data detection by block 208, which data detection can be performed using conventional baseband demodulation techniques such as QPSK, for example. The offset detected by FLL 202 is supplied to carrier frequency control 206. Further offset information can be determined during data detection by continuous comparison of the received signal and detected signal in block 206, which information can be used to further refine the remote unit carrier frequency.

It will be understood by those skilled in the art that other remote unit receiver or transceiver components are possible in addition to those described above and below. However, a detailed description thereof is not necessary for an understanding of the present invention.

Figure 3:
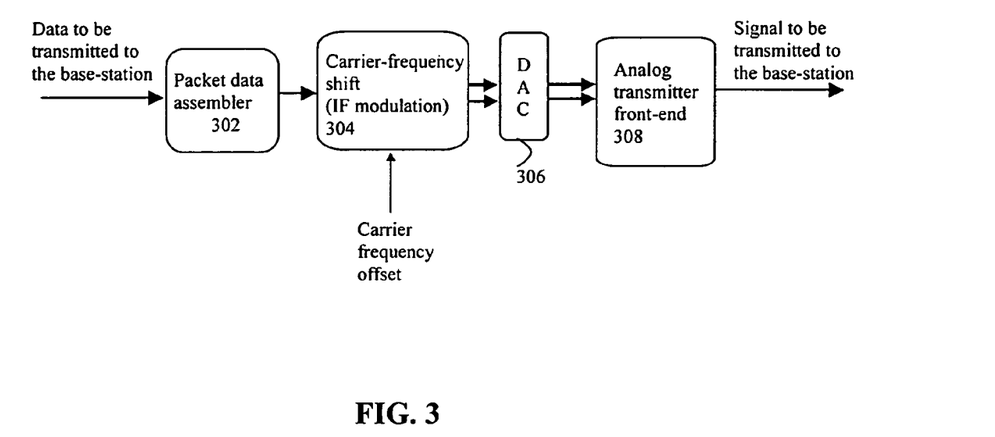
FIG. 3 illustrates a transmitter in a remote unit that corrects for carrier frequency offsets in accordance with a first embodiment of the invention.

When the remote unit transmits data to the base station, the remote unit performs a frequency shift in the digital domain before sending the data to the DAC. More particularly, in the remote unit transmitter as illustrated in FIG. 3, data to be transmitted is assembled in packets (in accordance with the communication protocol used by the system) by assembler 302. From there, the assembled data is digitally shifted in frequency by block 304 using the carrier offset information detected by the receiver in FIG. 2. The shifted digital data is then converted to analog by DAC 306 and transmitted by transmitter 308.

Frequency shift block 304 performs a multiplication of the assembled data and a complex sinusoidal (or a simple sinusoidal if the data is real only) and can be implemented by, for example, a dedicated-hardware multiplier or software executing on a digital signal processor. Transmitter 308 performs filtering, up-conversion mixing and amplification before sending the data to the antenna for transmission.

Figure 4:
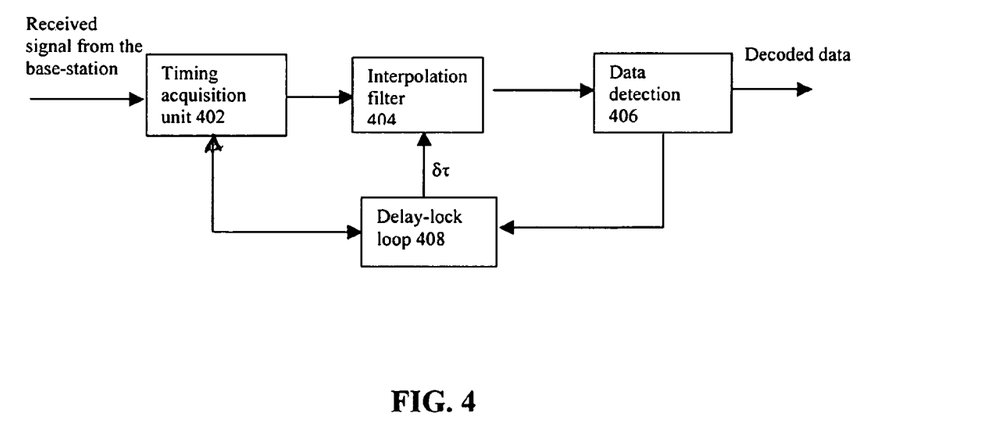
FIG. 4 illustrates a receiver in a remote unit that detects sampling frequency offsets in accordance with a second embodiment of the invention.

A second preferred embodiment of the invention provides for digital correction of sampling frequency offsets. FIG. 4 illustrates a remote unit receiver that includes a delay-lock loop to accurately determine the correct sampling point of the received signal. If the received signal is generated at a rate faster than the local sampling frequency, i.e. the base station DAC clock is faster than the remote unit ADC clock, then occasionally two samples will be received in one ADC clock cycle. If the received signal is generated at a rate slower than the ADC sampling frequency, i.e. the base station DAC clock is slower than the remote unit ADC clock, then occasionally no sample will be received in one ADC clock cycle. In the conventional design, the correct sampling point relative to the ADC clock, δτ, detected by the delay-lock loop, is used to interpolate the correct sample from the ADC output.

As shown in FIG. 4, a remote unit receiver in this embodiment of the invention includes a timing acquisition unit 402, interpolation filter 404, data detection block 406, and delay-lock loop 408. Timing acquisition unit 402 samples the received data based on the timing information from delay-lock loop 408; delay-lock loop 408 compares the sampled data and detected data and generates the timing offset δτ; interpolation filter 404 filters the incoming samples and generates the interpolated sample at δτ offset in time from the original sample; data detection block 406 performs the final signal detection. These components can be implemented, for example, by either dedicated-hardware or software executing on a digital signal processor.

Figure 5:
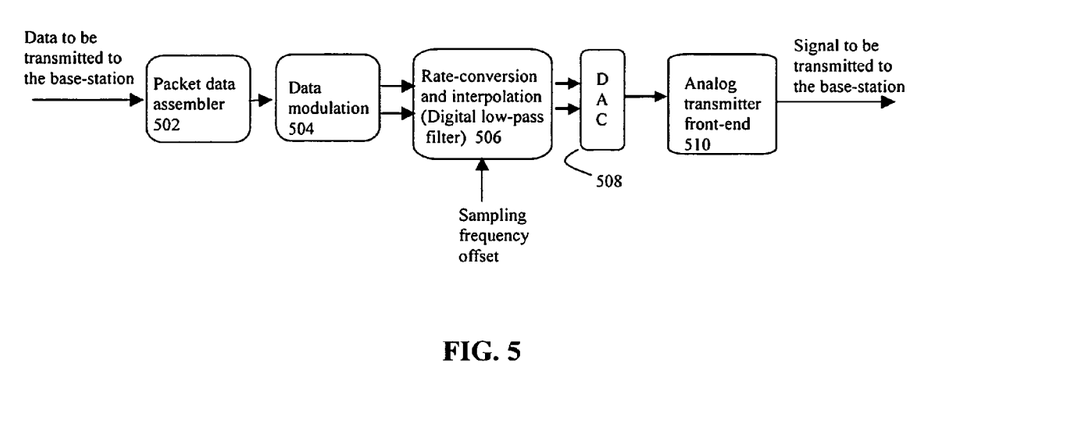
FIG. 5 illustrates a transmitter in a remote unit that corrects for sampling frequency offsets in accordance with a second embodiment of the invention.

An example of a remote unit transmitter that can be used to transmit a sampling frequency-corrected signal in this embodiment of the invention is illustrated in FIG. 5. As illustrated in FIG. 5, this embodiment of the invention uses the detected δτ (from delay-lock loop 408, for example) to perform sampling rate conversion on the data to be transmitted by way of a digital lowpass filter 506.

More particularly, the remote unit 100 modulates the data (after being assembled into packets by assembler 502 in accordance with the communication protocol) in data modulation block 504 using, for example, QPSK. 506, the rate-conversion and interpolation block, then interpolates data at the appropriate sampling points based on the sampling frequency of the base station which is determined from the detected δτ. The interpolation filter 506 can be any low-pass filter with a reasonable frequency response, but preferably a pulse-shaping filter so that spectrum-shaping can be performed simultaneously. The interpolated data is then converted to an analog signal using a DAC 508, clocked at the remote unit's sampling frequency. The analog signal will thus display the timing properly synchronized with the sampling frequency at the base station. The analog signal is then filtered, up-converted and amplified in the analog front-end circuitry 510 before being sent to the antenna for transmission.

Figure 6:
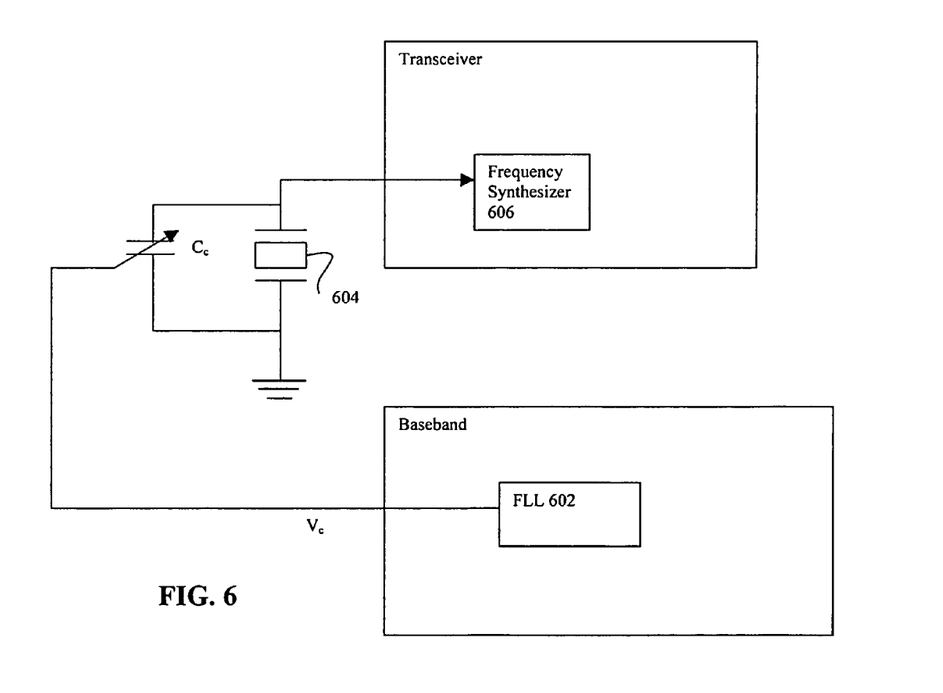
FIG. 6 illustrates a transceiver in a remote unit that corrects for carrier frequency offsets in accordance with a third embodiment of the invention.

A third preferred embodiment of the present invention provides for analog correction of carrier frequency offsets, and is illustrated in FIG. 6.

In this embodiment, a closed-loop system corrects the frequency offset between the remote unit and the base station carrier frequencies. The system of this embodiment functions as follows. In the remote unit, a frequency-locked loop 602, which can be the same as FLL 202 in FIG. 2, detects the frequency offset between the two carrier frequencies and generates a signal $V_c$ that is proportional to the difference between the two carrier frequencies. This signal is then used to adjust the capacitance of capacitor $C_c$, which in turn changes the resonance frequency of crystal oscillator 604 in a direction that corrects the frequency offset. It should be noted that capacitor $C_c$ can be placed either in parallel or in series with the crystal depending on the oscillator's architecture, and that other variably adjustable passive or active devices can be used. The reference frequency provided by oscillator 604 is supplied to frequency synthesizer 606 which produces the adjusted carrier frequency that is modulated before transmission to the base station. Since the carrier frequency is adjusted in transmission, the base station will properly demodulate the data from the reverse link signal. A description for the operation of the frequency synthesizer block can be found in "RF Microelectronics" by Behzad Razavi, Prentice Hall, 1998.

A fourth preferred embodiment of the present invention provides for analog correction of sampling frequency offsets, for example by varying the sampling clock of the analog-to-digital converter (ADC) and/or digital-to-analog converter (DAC). More particularly, the sampling frequency and phase offsets can be corrected in the remote unit in the analog domain by varying the sampling phases of the ADC of a receiver or the DAC of a transmitter. In accordance with one aspect of the invention, phase interpolation can be used to generate the sampling clock of an ADC for receive, and phase interpolation can be used to generate the sampling clock of a DAC for transmit.

Receivers of sampled data systems (such as radio) require some form of timing recovery mechanism to align the sampling frequency and phase of the receiver to that of the transmitter. This operation can be done in the analog domain by adjusting the sampling clock of the ADC as described in, for example, P. Roo, et al., International Solid State Circuits Conference 1998, pp. 392-393 and T. Lee, et. al., International Solid State Circuits Conference 1994, pp. 300-301.

Figure 7:
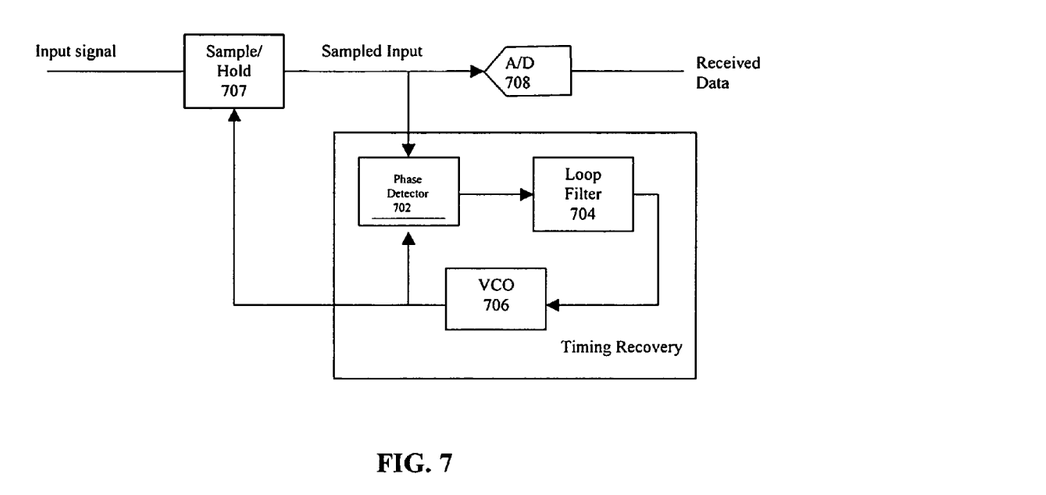
FIG. 7 illustrates a receiver in a remote unit that detects sampling frequency offsets in accordance with a fourth embodiment of the invention.

FIG. 7 shows an analog timing recovery system in accordance with the analog implementation described above that uses a phase detector 702, loop filter 704 and a voltage-controlled oscillator (VCO) 706 to generate the desired sampling clock for the ADC 708 of the receiver. The phase detector 702, loop filter 704, and VCO 706 form a conventional phase/frequency-locked loop that keeps the phase and frequency of the sampled input signal equal to that of the VCO output. The phase detector 702 compares the phase/frequency of the sampled input signal and the VCO output, loop filter 704 is a low-pass filter and can be implemented using R-C circuits. The output of the loop filter is a dc (or low frequency signal) that sets the phase/frequency of the VCO output so that it is equal to that of the sampled input signal.

Figure 8:
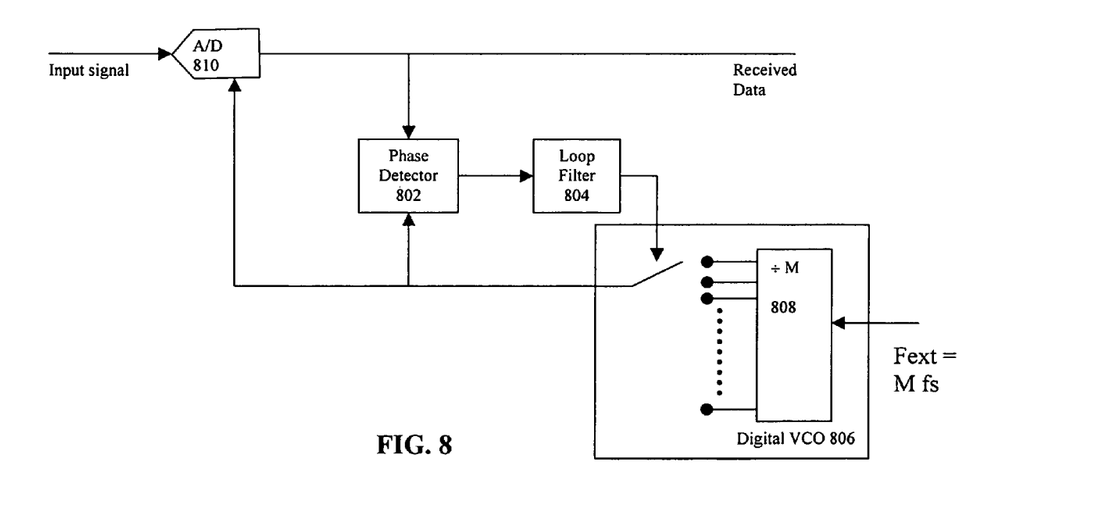
FIG. 8 illustrates an alternative receiver in a remote unit that detects sampling frequency offsets in accordance with a fourth embodiment of the invention.

An alternative implementation of this embodiment is shown in FIG. 8 whereby the phase detector 802, loop filter 804, and VCO 806 are implemented as digital circuits. A typical way to implement a digital VCO is to include a divider 808 that derives the sampling clock from an external reference clock $F_{EXT}$ that is M times faster than the desired sampling clock (where M can be selected from a number of alternative integers). The precision of the timing recovery is quantized to the nearest sampling edge of the external reference clock $F_{EXT}$.

In high speed communication systems where the sampling frequency can be over 100 MHz, however, the design of a digital VCO with an external reference clock that is M times faster is not desirable. According to an aspect of the present invention, a technique is provided to perform timing recovery using digital circuits without the need for a reference clock that is M times faster than the sampling frequency. The basic idea to generate the M phases of the sampling clock by using phase interpolator, which can be implemented using techniques such as those described in T. Knotts, et. al, International Solid State Circuits Conference 1994, pp. 58-59 and D. Chu and T. Knotts, U.S. Pat. No. 5,166,959.

Figure 9:
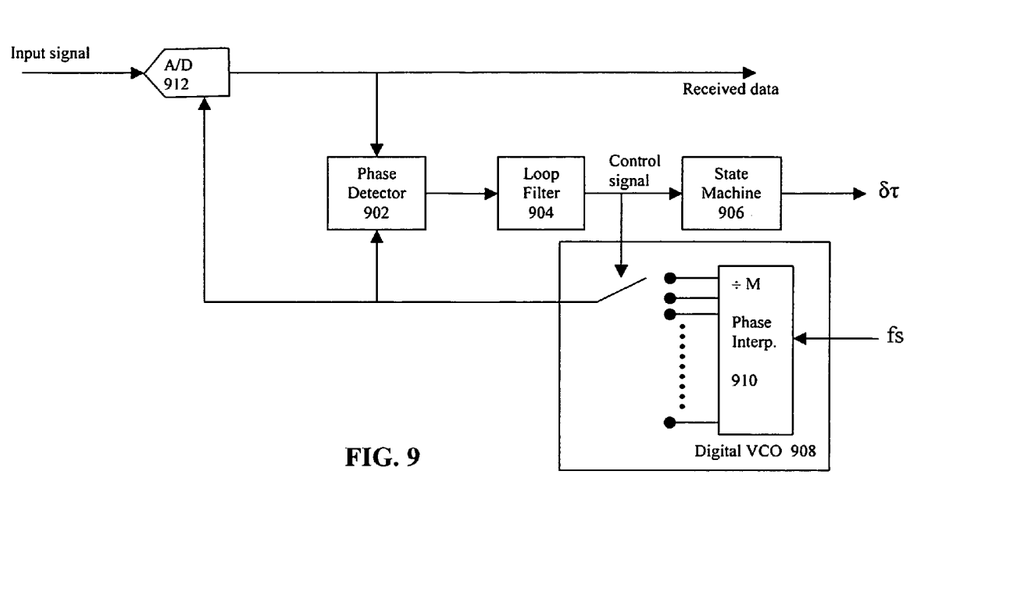
FIG. 9 illustrates a receiver in a remote unit that detects sampling frequency offsets in accordance with a fourth embodiment of the invention.
Figure 10:
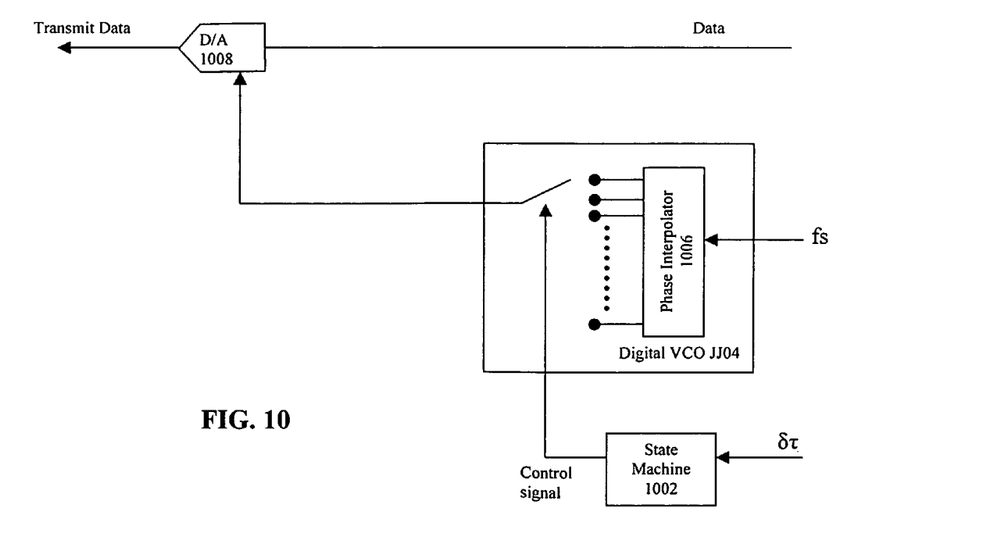
FIG. 10 illustrates a transmitter in a remote unit that corrects for sampling frequency offsets in accordance with a fourth embodiment of the invention.

A closed loop system for digital timing recovery of sampling frequency offsets in accordance with this aspect of the invention is illustrated in FIGS. 9 and 10.

As shown in FIG. 9, the timing recovery circuit consists of a digital phase detector 902 and a digital loop filter 904, which can be the same as those described above. Digital VCO 908 in this example of the invention, however, includes a phase interpolator 910 which generates M phases of the sampling clock using techniques such as those described in T. Knotts, et. al, International Solid State Circuits Conference 1994, pp. 58-59 and D. Chu and T. Knotts, U.S. Pat. No. 5,166,959. The phase detector 902 compares the digitized input signal (at Nyquist rate) with the sampling frequency. This phase comparison can be done using a digital multiplier or more simply with adders if the characteristics of the incoming signal are known. The loop filter 904 typically consists of at least one integrator (accumulator) and compensation network. State machine 906 monitors the frequency and phase offsets of the input sampling signal and can be implemented by using standard digital logic such as those described in (or any other logic text on state machines) Hill & Peterson, Introduction to Switching Theory & Logical Design, $2^{nd}$ Ed., John Wiley & Sons, 1981.

The timing recovery loop works as follows. The phase of the incoming signal is compared to the sampling clock. The difference in phase is accumulated by loop filter 904 and then used to produce a control signal that selects the most appropriate phase of the sampling clock produced by interpolator 910. Since the operation is a closed loop system, the phase adjustment need only provide the direction of the phase change not the absolute phase change.

The frequency offset adjustment process can be illustrated with the following example. If the receiver clock Fs is 10% faster than the transmitter clock and M is chosen to be 10, the timing recovery logic should reduce the receiver clock period by 1/M, i.e. one period after every 10 Fs periods. The resultant receiver Fs should thus have the same average frequency as the transmitter frequency. The error due to the discrete choice of sampling phases can usually be tolerated as long as M is sufficiently large. The use of phase interpolation allows an implementation that does not require an external high frequency clock.

The phase interpolation approach described above can be applied to the transmitter to correct for frequency offsets during transmission in accordance with the invention. In this approach, the average change in the phase selection algorithm in FIG. 9 during the receive operation is used for transmit. For example, if the receiver timing recovery reduces the sampling clock period Fs by 1/M, or one period for every 10 Fs periods, the transmitter can use the same phase change for the transmitted data as shown in FIG. 10. The receive circuit in FIG. 9 preferably includes an additional state machine 906 to monitor the control signal to the digital VCO 908 in order to record the frequency and amplitude of the phase changes. This information is provided to the transmit circuit in FIG. 10 and used by state machine 1002 to control the phase selection of the digital VCO 1004 consisting of phase interpolator 1006 to adjust the sampling frequency for DAC 1008 so that the transmit signal will have the same average sampling frequency as the received signal.

It should be apparent that although the frequency correction operations of the invention have been generally described hereinabove as taking place in the transceiver of a remote unit, that such operations can also take place in the transceiver of a base station, or in any transceiver or transmitter of a first unit in communication with another transceiver of transmitter of a second unit where a shared reference frequency or commonly used frequency is used by the first and second units.

Moreover, other embodiments of the invention are possible. For example, the transmitter-corrected frequency offset scheme can be applied to any digital communication system for better performance or lower-cost implementations. It is especially suited for applications that explore diversity to facilitate multiple access. Some such examples are multi-user detection systems employing antenna diversity or smart antennas, multi-carrier OFDM, DMT, etc. This invention allows the transmitted signals from multiple sources to be frequency-locked to the receiver, so that the signals from multiple sources are synchronized in both frequency and time.

Other embodiments of this invention can also include any point-to-point or broadcast channels, such as those used in ADSL or cable modem systems.

As a further alternative, the information on the frequency offsets can be sent from the receiver, after it has been detected, to the transmitter so that the transmitter can adjust its carrier frequency and/or sampling frequency accordingly for next transmission. For example, to reduce the hardware complexity or power consumption of a first transceiver, such as a remote unit, a second transceiver in communication therewith, e.g., a base station, can detect the frequency offset relative to the first transceiver, and send the offset information to the first transceiver in the forward link. The first transceiver, after receiving the offset information, probably through a low-rate channel or a broadcast channel, will correct the frequencies as described in this invention. This is the scheme for closed loop frequency control.

The offset information can also be sent from the receiver of a first transceiver, to the transmitter of a second transceiver, for the second transceiver to correct its frequencies during receiving. For example, to reduce the hardware complexity of a first transceiver such as a remote unit, the sampling frequency offset information can be sent to a second transceiver such as a base station. The second transceiver, after receiving the offset information, will interpolate the received data accordingly, which enhances the detection capabilities without requiring the first transceiver to perform sampling rate conversion.

Although the present invention has been described in detail with reference to the preferred embodiments thereof, those skilled in the art will appreciate that various substitutions and modifications can be made to the examples described herein while remaining within the spirit and scope of the invention as defined in the appended claims.

What is claimed is:

1. A device in a communication system, the communication system using one of OFDM, NBFDM, DMT, FDMA and TDMA, the communication system including a plurality of remote transceiver units and a central transceiver unit disposed remotely from the plurality of remote transceiver units, the plurality of remote transceiver units operable to communicate in a continuous bi-directional manner for direct exchange of information with the central transceiver unit, the device for providing that each of the plurality of remote transceiver units communicate with the central transceiver unit using a common frequency, the device comprising:

means for detecting, responsive to a continuous comparison of received and detected signals in each of the remote transceiver units, a comparative offset between common frequency references used locally by the remote transceiver units and the common frequency used by the central transceiver unit in at least one first signal transmitted between the central and the remote transceiver units, wherein the common frequency reference is a carrier frequency in a first remote transceiver unit and a sampling frequency in a second remote transceiver unit;

means for adjusting the common frequency reference in each of the remote transceiver units in accordance with the offset in at least one second signal to be transmitted between the remote and central transceiver units to correct for an error in the common frequency reference, so that effects of the offset in each of the remote transceiver units will be substantially reduced in preemptive manner, the second signal being in substantial frequency lock with the common frequency.

2. A device according to claim 1, wherein the means for detecting in the first remote transceiver unit includes means for performing a correlation on a digital representation of the first signal so as to lock onto the offset in the carrier frequency.

3. A device according to claim 1, wherein the means for adjusting in the first remote transceiver unit includes means for digitally shifting data in frequency in accordance with the carrier frequency and the offset corresponding thereto.

4. A device according to claim 1, wherein the means for detecting in the first remote transceiver unit includes means for locking onto the offset in the carrier frequency and for producing an output signal corresponding thereto.

5. A device according to claim 4, wherein the means for adjusting in the first remote transceiver unit includes means for variably adjusting a reference frequency output by a crystal oscillator in accordance with the output signal.

6. A method used in a communication system, the communication system using one of OFDM, NBFDM, DMT, FDMA and TDMA, wherein the communication system comprises a plurality of remote transceiver units operable to communicate in a continuous bi-directional manner for direct exchange of information with a central transceiver unit disposed remotely from the plurality of remote transceiver units, and wherein each of the plurality of remote transceiver units operates to communicate with the central transceiver unit using a common frequency, the method comprising:

detecting, responsive to a continuous comparison of received and detected signals in each of the remote transceiver units, a comparative offset between common frequency references used locally by the remote transceiver units and the common frequency used by the central transceiver unit in at least a first signal transmitted between the central and the remote transceiver units, wherein the common frequency reference is a carrier frequency in a first remote transceiver unit and a sampling frequency in a second remote transceiver unit; and, adjusting the common frequency reference in each of the remote transceiver units in accordance with the offset in at least one second signal to be transmitted between the remote and the central transceiver units to correct for an error in the common frequency reference, so that effects of the offset in each of the remote transceiver units will be substantially reduced in preemptive manner, the second signal being in substantial frequency lock with the common frequency.

7. A method according to claim 6, wherein the step of detecting for the first remote transceiver unit includes performing a correlation on a digital representation of the first signal so as to lock onto the offset in the carrier frequency.

8. A method according to claim 6, wherein the step of adjusting for the first remote transceiver unit includes digitally shifting data in frequency in accordance with the carrier frequency and the offset corresponding thereto.

9. A method according to claim 6, wherein the step of detecting for the first remote transceiver unit includes locking onto the offset in the carrier frequency and producing an output signal corresponding thereto.

10. A method according to claim 9, wherein the step of adjusting for the first remote transceiver unit includes variably adjusting a reference frequency output by a crystal oscillator in accordance with the output signal.

11. A device usable in any of a plurality of remote transceiver units, the remote transceiver units operating to communicate with a central transceiver unit using a common frequency, the central transceiver unit being disposed remotely from the plurality of remote transceiver units, the device comprising:

a frequency lock loop in a first remote transceiver unit and a delay lock loop in a second remote transceiver unit, the frequency and delay lock loops coupled to receive digital representations of at least one first signal transmitted by the central transceiver unit, the frequency and delay lock loops being respectively adapted to detect comparative carrier and sampling frequency offsets in the first signal and to produce offset information indicative of offsets between common frequency references locally used at the remote transceiver units and the common frequency used at the central transceiver unit; and a frequency shift block in the first remote transceiver unit and a timing acquisition unit in the second remote transceiver unit, the frequency shift block and the timing acquisition unit coupled to receive the offset information and digital data to be transmitted and each to generate at least one second signal to be received by the central transceiver unit, the frequency shift block and the timing acquisition unit being respectively adapted to digitally shift and sample the digital data in frequency in accordance with the common frequency references and the carrier and the sampling frequency offsets corresponding thereto to correct for errors in the common frequency references, so that effects of the carrier and the sampling frequency offsets will be substantially reduced in preemptive manner for continuous wireless bi-directional communication between the remote and the central transceiver units for direct exchange of information.

12. A device usable in any of a plurality of remote transceiver units, the plurality of remote transceiver units to communicate with a central transceiver unit using a common frequency, the central transceiver unit being disposed remotely from the plurality of remote transceiver units, the device comprising:

a frequency lock loop in a first remote transceiver unit and a delay lock loop in a second remote transceiver unit, the frequency and delay lock loops coupled to receive digital representations of at least one first signal transmitted by the central transceiver unit, the frequency and delay lock loops being respectively adapted to detect comparative carrier and sampling frequency offsets in the first signal and to produce analog offset signals indicative of offsets between common frequency references locally used at the remote transceiver units and the common frequency used at the central transceiver unit;

a crystal oscillator in the first remote transceiver unit that supplies a reference frequency for modulating at least one second signal substantially locked with the common frequency; and a variably adjustable device coupled to receive the analog offset signals, the variably adjustable device being respectively adapted to adjust the reference frequency of the crystal oscillator and a sampling clock of an analogto-digital converter in accordance with the analog offset signals to correct for errors in the common frequency references, so that effects of the carrier and the sampling frequency offsets in the second signal to be perceived by the central transceiver unit will be substantially reduced in preemptive manner for continuous wireless bi-directional communication between the remote and the central transceiver units for direct exchange of information.

13. A device usable in a communication system, the communication system using one of OFDM, NBFDM, DMT, FDMA and TDMA, the communication system including a plurality of remote transceiver units operable to communicate in a continuous bi-directional manner for direct exchange of information with a central transceiver unit using a common frequency, the central transceiver unit being disposed remotely from the plurality of remote transceiver units, the device comprising:

means for detecting, responsive to a continuous comparison of received and detected signals in each of the remote transceiver units, a comparative offset between common frequency references used locally by said remote transceiver units and the common frequency used by the central transceiver unit in at least one first signal transmitted between the central and the remote transceiver units, wherein the common frequency reference is a carrier frequency in a first remote transceiver unit and a sampling frequency in a second remote transceiver unit;

means for communicating information corresponding to the offsets from the central transceiver unit to the first and second remote transceiver units; and means for adjusting the common frequency references in the first and the second remote transceiver units in accordance with the offsets in at least one second signal to be transmitted between the first or second remote transceiver unit and the central transceiver unit to correct for errors in the common frequency reference, so that effects of the offsets will be substantially reduced in preemptive manner, the second signal being in substantial frequency lock with the common frequency.

14. A device in a communication system, the communication system using one of OFDM, NBFDM, DMT, FDMA and TDMA, the communication system including a plurality of remote transceiver units and a central transceiver unit disposed remotely from the plurality of remote transceiver units, the plurality of remote transceiver units operable to communicate in continuous bi-directional manner for direct exchange of information with the central transceiver unit, the device for providing that each of the plurality of remote transceiver units communicate with the central transceiver unit using a common frequency, the device comprising:

means for detecting, responsive to a continuous comparison of received and detected signals in each of the remote transceiver units, a comparative offset between common frequency references used locally by the remote transceiver units and the common frequency used by the central transceiver unit in at least one first signal transmitted between the central and the remote transceiver units, wherein the common frequency reference is a carrier frequency in a first remote transceiver unit and a sampling frequency in a second remote transceiver unit;

means for communicating information corresponding to the offsets from the central transceiver unit to the first and second remote transceiver units; and means for adjusting the common frequency reference in each of the first and the second remote transceiver units in accordance with the offsets in at least one second signal to be transmitted between the remote and the central transceiver units to correct for errors in the common frequency references, so that effects of the offsets will be substantially reduced in preemptive manner, the second signal being in substantial frequency lock with the common frequency.

\* \* \* \* \*